(12) United States Patent
Nirmal et al.

(10) Patent No.: US 6,855,384 B1
(45) Date of Patent: Feb. 15, 2005

(54) SELECTIVE THERMAL TRANSFER OF LIGHT EMITTING POLYMER BLENDS

(75) Inventors: Manoj Nirmal, St. Paul, MN (US); Ha T. Le, St. Paul, MN (US); Martin B. Wolk, Woodbury, MN (US); Erika Bellmann, St. Paul, MN (US); Fred McCormick, Maplewood, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/662,980

(22) Filed: Sep. 15, 2000

(51) Int. Cl.⁷ .............................................. B41M 5/40
(52) U.S. Cl. .................. 428/32.6; 156/235; 428/32.81; 428/690
(58) Field of Search ........................ 156/235; 428/32.6, 428/32.81, 690

(56) References Cited

U.S. PATENT DOCUMENTS

| | | | |
|---|---|---|---|
| 4,252,671 A | 2/1981 | Smith | 252/430 |
| 5,061,569 A | 10/1991 | VanSlyke et al. | 428/457 |
| 5,166,024 A | 11/1992 | Bugner et al. | 430/70 |
| 5,256,506 A | 10/1993 | Ellis et al. | 430/20 |
| 5,351,617 A | 10/1994 | Williams et al. | 101/467 |
| 5,521,035 A | 5/1996 | Wolk et al. | 430/20 |
| 5,685,939 A | 11/1997 | Wolk et al. | 156/234 |
| 5,688,551 A | 11/1997 | Littman et al. | 427/64 |
| 5,691,098 A | 11/1997 | Busman et al. | 430/158 |
| 5,693,446 A | 12/1997 | Staral et al. | 430/201 |
| 5,707,745 A | 1/1998 | Forrest et al. | 428/432 |
| 5,710,097 A | 1/1998 | Staral et al. | 503/227 |
| 5,725,989 A | 3/1998 | Chang et al. | 430/201 |
| 5,777,070 A | 7/1998 | Inbasekaran et al. | 528/394 |
| 5,904,961 A | 5/1999 | Tang et al. | 427/561 |
| 5,937,272 A | 8/1999 | Tang et al. | 498/30 |
| 5,998,085 A | 12/1999 | Isberg et al. | 430/200 |
| 6,114,088 A | 9/2000 | Wolk et al. | 430/273.1 |

FOREIGN PATENT DOCUMENTS

| | | |
|---|---|---|
| EP | 851 714 A2 | 1/1998 |
| EP | 1 146 574 | * 10/2001 |
| WO | WO 92/06410 A | 4/1992 |
| WO | WO 92/06410 | 4/1992 |
| WO | WO 97/15173 | 4/1997 |
| WO | WO 99/46961 | 9/1999 |
| WO | WO 00/14777 | 3/2000 |
| WO | WO 00/41893 | 7/2000 |
| WO | WO 00/46321 | 8/2000 |

OTHER PUBLICATIONS

*Trends in Polymer Science,* 2. pp. 350–355, 1994, "Organic Electroluminescent Devices Based on Polymeric Materials" J. Kido.
*Thin Solid Films,* 276, pp. 13–20, 1996, "Light–emitting and photoconductive diodes fabricated with conjugated polymers" J.J. M. Halls et al.
*Macromolecular Symposia,* 125, pp. 1–48, 1997 "Recent Developments in Molecular Organic Electroluminescent Materials".
*Acta Polym.,* 49, pp. 319–344, 1998 "The chemistry of electroluminescent organic materials" J.L. Segura.
*Angew. Chem. Int. Ed.,* 37, pp. 402–428, 1998 "Electroluminescent Conjugated Polymers–Seeing Polymers in a New Light" A. Kraft et al.
*MRS Bulletin,* 22, pp. 39–45, 1997 "Progress in Electroluminescent Devices Using Molecular Thin Films" T. Tsutsui.
*J. Amer. Chem. Soc.,* 118, pp. 3922–3929, 1996, "Polymer Light–Emitting Electrochemical Cells: In Situ Formation of a Light–Emitting p–n Junction" Q. Pei et al.
*Science,* 276, pp. 2009–2011, 1997 "Three–Color, Tunable, Organic Light–Emitting Devices" Z. Shen et al.

* cited by examiner

*Primary Examiner*—B. Hamilton Hess

(57) ABSTRACT

The present invention provides a selectively thermally transferable blend capable of forming the emissive layer of an organic electroluminescent device. The blend includes a light emitting polymer and an additive selected to promote selective thermal transfer of the blend from a donor element to a proximately located receptor substrate.

26 Claims, 1 Drawing Sheet

SELECTIVE THERMAL TRANSFER OF LIGHT EMITTING POLYMER BLENDS

BACKGROUND

Pattern-wise thermal transfer of materials from donor sheets to receptor substrates has been proposed for a wide variety of applications. For example, materials can be selectively thermally transferred to form elements useful in electronic displays and other devices. Specifically, selective thermal transfer of color filters, black matrix, spacers, polarizers, conductive layers, transistors, phosphors, and organic electroluminescent materials have all been proposed. Selective thermal transfer of organic light emitters for formation of organic electroluminescent devices has been shown to be particularly useful.

SUMMARY OF THE INVENTION

Selective thermal transfer of organic electroluminescent materials (also referred to as organic light emitters), and more specifically of light emitting polymers (LEPs), can be important in patterning organic light emitting devices (OLEDs, also referred to as organic electroluminescent devices). More traditional patterning methods including photolithographic techniques, shadow mask techniques, screen printing techniques, and others, have been problematic in patterning organic light emitters, especially for making OLEDs based on LEPs and/or in making high resolution pixilated displays. Selective thermal transfer can be a viable patterning method for a wide variety of organic light emitters and for a wide variety of display constructions.

Some LEPs can be difficult to selectively thermally transfer with high fidelity in their pure form. In many cases, this might be attributed to physical and mechanical properties of the film or coating of LEP material being transferred. Some physical and mechanical properties that may be important include molecular weight, intra-layer cohesive strength, and the like. The present invention contemplates blending LEPs with other materials to modify the physical and/or mechanical properties of the LEP-based emissive layer being patterned to improve thermal transfer fidelity while maintaining desired functionality of the emissive layer in an OLED.

In one embodiment, the present invention provides a thermal transfer donor element that includes a substrate and a transfer layer capable of being selectively thermally transferred from the donor element, the transfer layer including a blend of a light emitting polymer and an additive. The additive can be selected to promote high fidelity thermal transfer of the transfer layer. The blend is capable of forming the emissive layer of an organic electroluminescent device.

In another embodiment, the present invention provides a process for patterning a light emitting polymer, including the steps of providing a thermal transfer donor element, bringing the donor element into close proximity with a receptor substrate, and selectively thermally transferring the transfer layer from the donor to the receptor. The donor element includes a substrate and a transfer layer that includes a blend of a light emitting polymer and an additive. The additive can be selected to promote high fidelity thermal transfer of the transfer layer. The blend is capable of forming the emissive layer of an organic electroluminescent device.

BRIEF DESCRIPTION OF THE DRAWINGS

The invention may be more completely understood in consideration of the following detailed description of various embodiments of the invention in connection with the accompanying drawings, in which.

Figure 1:
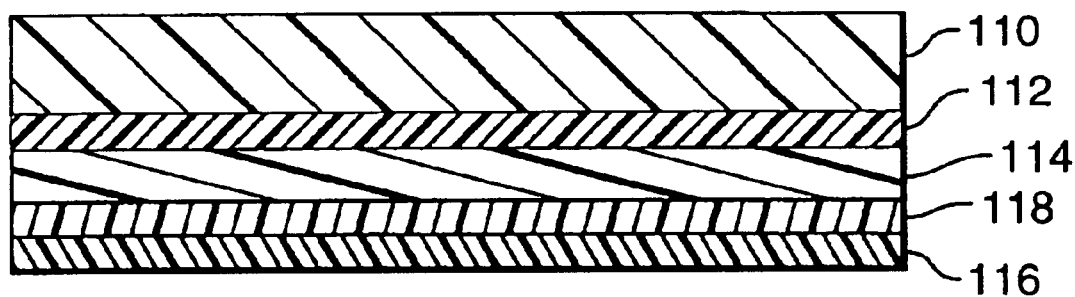
FIG. 1 is a schematic cross section of a thermal transfer donor element.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be applicable to thermal mass transfer of LEP materials from a donor element to a receptor to form OLEDs or portions thereof. In particular, the present invention is directed to thermal mass transfer of blends of materials that include an LEP and an additive selected to promote thermal transfer, the blends capable of forming an emissive layer in an OLED. The present invention provides a donor element that includes a thermal transfer layer that includes a blend of an LEP and an additive selected to improve the fidelity of pattern-wise thermal transfer and to maintain device functionality (e.g., as compared to a device employing the LEP in its pure form) when the blend is transferred as the emissive layer of an OLED. According to the present invention, selectively thermally transferable LEP blends can be prepared that include an LEP and a compatible additive such as another polymer, oligomer, or small molecule organic material that is either inert or active (e.g., charge carrying, emissive, conductive) in the emissive layer of an OLED. The additive can be selected to promote thermal transfer properties, for example by reducing intra-layer cohesive energy in the transfer layer, altering average molecular weight, enhancing adhesion to the receptor upon transfer, and the like.

Examples of classes of LEP materials that can be used in blends of the present invention include poly(phenylenevinylene)s (PPVs), poly-para-phenylenes (PPPs), polyfluorenes (PFs), and co-polymers thereof. Examples of suitable LEP materials can also be found in J. L. Segura, "The Chemistry of Electroluminescent Organic Materials", *Acta Polym.*, 49, pp. 319–344 (1998), and A. Kraft et al., "Electroluminescent Conjugated Polymers—Seeing Polymers in a New Light", *Angew. Chem. Int. Ed.*, 37, pp. 402–428 (1998). Suitable LEPs can also be molecularly doped, dispersed with fluorescent dyes, etc. Other types of polymer-based emissive materials include small molecule light emitters dispersed in a polymer matrix. For example, poly(9-vinylcarbazole), commonly known as PVK, PVCz, or polyvinylcarbazole, is frequently used as a polymeric matrix for dispersing small molecules for hybrid OLEDs.

Examples of additives that can be used in blends of the present invention include small molecule organics (inert, conductive, light emitting), oligomers of the LEP in the blend or of different polymers (inert, conductive, conjugated), other polymers (inert, conductive, conjugated), plasticizers, tackifying resins, and others. LEP blends should include compatible materials, for example materials that are soluble in some of the same solvents and that can be coated to form a uniform film when blended.

LEP blends can be selectively thermally transferred from one or more donor elements as single layers to form emissive layers in OLEDs, or can be selectively thermally transferred from one or more donor elements as a layer of multiple layer stacks (e.g., stacks that include one or more of a charge transport layer, a charge injection layer, a buffer layer, an electrode layer, an adhesive layer, etc., along with the emissive LEP blend layer) to form OLEDs.

The ability to blend selected compatible additives with materials can enable higher fidelity patterning of a wider range of emissive materials for OLEDs. This can be particularly useful when thermally transferring high molecular weight LEPs or LEPs that, in their pure form, exhibit a high intra-layer cohesive strength. In some instances, it may be difficult to thermally transfer such materials. Because such materials provide functionality, it also may be seen as not desirable to alter them from their pure form in order to improve their transferability in thermal patterning operations. The present invention, however, shows that LEP blends can be made that allow for enhancement of thermal transfer properties by altering physical and mechanical properties of LEP layers while maintaining, and in some cases improving, the light emission functionality of the LEP in an OLED.

The present invention contemplates donor elements that include LEP blends in their transfer layers, processes of selectively transferring LEP blends, and displays and devices made by selective thermal transfer of LEP blends. FIG. 1 shows an example of a thermal transfer donor 100 suitable for use in the present invention. Donor element 100 includes a base substrate 110, an optional underlayer 112, a light-to-heat conversion layer (LTHC layer) 114, an optional interlayer 118, and a transfer layer 116. Other layers can also be present. Exemplary donors are disclosed in U.S. Pat. Nos. 6,114,088; 5,998,085; and 5,725,989, in International Publication No. 00/41893, and in co-assigned U.S. patent application Ser. Nos. 09/473,114 and 09/474,002.

In processes of the present invention, materials can be transferred from the transfer layer of a thermal mass transfer donor element to a receptor substrate by placing the transfer layer of the donor element adjacent to the receptor and irradiating the donor element with imaging radiation that can be absorbed by the LTHC layer and converted into heat. The donor can be exposed to imaging radiation through the donor substrate, or through the receptor, or both. The radiation can include one or more wavelengths, including visible light, infrared radiation, or ultraviolet radiation, for example from a laser, lamp, or other such radiation source. Material from the thermal transfer layer can be selectively transferred to a receptor in this manner to imagewise form patterns of the transferred material on the receptor. In many instances, thermal transfer using light from, for example, a lamp or laser, is advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the thermal mass transfer element, and/or the materials of the thermal mass transfer element. The transferred pattern can also be controlled by irradiating the donor element through a mask.

Alternatively, a thermal print head or other heating element (patterned or otherwise) can be used to selectively heat the donor element directly, thereby pattern-wise transferring portions of the transfer layer. In such a case, the LTHC layer in the donor sheet is optional. Thermal print heads or other heating elements may be particularly suited for patterning devices for lower resolution information displays including segmented displays, emissive icons, and the like.

The mode of thermal mass transfer can vary depending on the type of irradiation, the type of materials and properties of the LTHC layer, the type of materials in the transfer layer, etc., and generally occurs via one or more mechanisms, one or more of which may be emphasized or de-emphasized during transfer depending on imaging conditions, donor constructions, and so forth. One mechanism of thermal transfer includes thermal melt-stick transfer whereby localized heating at the interface between the thermal transfer layer and the rest of the donor element can lower the adhesion of the thermal transfer layer to the donor in selected locations. Selected portions of the thermal transfer layer can adhere to the receptor more strongly than to the donor so that when the donor element is removed, the selected portions of the transfer layer remain on the receptor. Another mechanism of thermal transfer includes ablative transfer whereby localized heating can be used to ablate portions of the transfer layer off of the donor element, thereby directing ablated material toward the receptor. Yet another mechanism of thermal transfer includes sublimation whereby material dispersed in the transfer layer can be sublimated by heat generated in the donor element. A portion of the sublimated material can condense on the receptor. The present invention contemplates transfer modes that include one or more of these and other mechanisms whereby the heat generated in an LTHC layer of a thermal mass transfer donor element can be used to cause the transfer of materials from a transfer layer to receptor surface.

A variety of radiation-emitting sources can be used to heat thermal mass transfer donor elements. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power ($\geq 100$ mW) single mode laser diodes, fiber-coupled laser diodes, and diode-pumped solid state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 $J/cm^2$ or more. Other radiation sources and irradiation conditions can be suitable based on, among other things, the donor element construction, the transfer layer material, the mode of thermal mass transfer, and other such factors.

When high spot placement accuracy is required (e.g., for high information full color display applications) over large substrate areas, a laser is particularly useful as the radiation source. Laser sources are also compatible with both large rigid substrates (e.g., 1 m×1 m×1.1 mm glass) and continuous or sheeted film substrates (e.g., 100 $\mu$m thick polyimide sheets).

During imaging, the thermal mass transfer element can be brought into intimate contact with a receptor (as might typically be the case for thermal melt-stick transfer mechanisms) or the thermal mass transfer element can be spaced some distance from the receptor (as can be the case for ablative transfer mechanisms or transfer material sublimation mechanisms). In at least some instances, pressure or vacuum can be used to hold the thermal transfer element in intimate contact with the receptor. In some instances, a mask can be placed between the thermal transfer element and the receptor. Such a mask can be removable or can remain on the receptor after transfer. A radiation source can then be used to heat the LTHC layer (and/or other layer(s) containing radiation absorber) in an imagewise fashion (e.g., digitally or by analog exposure through a mask) to perform imagewise transfer and/or patterning of the transfer layer from the thermal transfer element to the receptor.

Typically, selected portions of the transfer layer are transferred to the receptor without transferring significant portions of the other layers of the thermal mass transfer element, such as the optional interlayer or the LTHC layer. The presence of the optional interlayer may eliminate or reduce the transfer of material from the LTHC layer to the receptor and/or reduce distortion in the transferred portion of the transfer layer. Preferably, under imaging conditions, the adhesion of the optional interlayer to the LTHC layer is greater than the adhesion of the interlayer to the transfer layer. In some instances, a reflective interlayer can be used to attenuate the level of imaging radiation transmitted through the interlayer and reduce any damage to the transferred portion of the transfer layer that may result from interaction of the transmitted radiation with the transfer layer and/or the receptor. This is particularly beneficial in reducing thermal damage which may occur when the receptor is highly absorptive of the imaging radiation.

Large thermal transfer elements can be used, including thermal transfer elements that have length and width dimensions of a meter or more. In operation, a laser can be rastered or otherwise moved across the large thermal transfer element, the laser being selectively operated to illuminate portions of the thermal transfer element according to a desired pattern. Alternatively, the laser may be stationary and the thermal transfer element and/or receptor substrate moved beneath the laser.

In some instances, it may be necessary, desirable, and/or convenient to sequentially use two or more different thermal transfer elements to form electronic devices on a receptor. For example, multiple layer devices can be formed by transferring separate layers or separate stacks of layers from different thermal transfer elements. Multilayer stacks can also be transferred as a single transfer unit from a single donor element. Examples of multilayer devices include transistors such as organic field effect transistors (OFETs), organic electroluminescent pixels and/or devices, including OLEDs. Multiple donor sheets can also be used to form separate components in the same layer on the receptor. For example, three different donors that each have a transfer layer comprising an organic electroluminescent material that emits a different color (for example, red, green, and blue) can be used to form RGB sub-pixel OLED elements for a color electronic display. Also, separate donor sheets, each having multiple layer transfer layers, can be used to pattern different multilayer devices (e.g., OLEDs that emit different colors, OLEDs and OFETs that connect to form addressable pixels, etc.). Typically, materials from separate donor sheets are transferred adjacent to other materials on a receptor for form adjacent devices, portions of adjacent devices, or different portions of the same device. Alternatively, materials from separate donor sheets can be transferred directly on top of, or in partial overlying registration with, other layers or materials previously patterned onto the receptor either by thermal transfer or some other transfer method. A variety of other combinations of two or more thermal transfer elements can be used to form a device, each thermal transfer element forming one or more portions of the device. It will be understood other portions of these devices, or other devices on the receptor, may be formed in whole or in part by any suitable process including photolithographic processes, ink jet processes, and various other printing or mask-based processes.

Referring back to FIG. 1, various layers of the thermal mass transfer donor element 100 will now be described.

The donor substrate 110 can be a polymer film. One suitable type of polymer film is a polyester film, for example, polyethylene terephthalate or polyethylene naphthalate films. However, other films with sufficient optical properties, including high transmission of light at a particular wavelength, as well as sufficient mechanical and thermal stability for the particular application, can be used. The donor substrate, in at least some instances, is flat so that uniform coatings can be formed. The donor substrate is also typically selected from materials that remain stable despite heating of the LTHC layer. However, as described below, the inclusion of an underlayer between the substrate and the LTHC layer can be used to insulate the substrate from heat generated in the LTHC layer during imaging. The typical thickness of the donor substrate ranges from 0.025 to 0.15 mm, preferably 0.05 to 0.1 mm, although thicker or thinner donor substrates may be used.

The materials used to form the donor substrate and an adjacent underlayer can be selected to improve adhesion between the donor substrate and the underlayer, to control heat transport between the substrate and the underlayer, to control imaging radiation transport to the LTHC layer, to reduce imaging defects and the like. An optional priming layer can be used to increase uniformity during the coating of subsequent layers onto the substrate and also increase the bonding strength between the donor substrate and adjacent layers. One example of a suitable substrate with primer layer is available from Teijin Ltd. (Product No. HPE100, Osaka, Japan).

An optional underlayer 112 may be coated or otherwise disposed between a donor substrate and the LTHC layer, for example to control heat flow between the substrate and the LTHC layer during imaging and/or to provide mechanical stability to the donor element for storage, handling, donor processing, and/or imaging. Examples of suitable underlayers and methods of providing underlayers are disclosed in co-assigned U.S. patent application Ser. No. 09/,743,114 (attorney docket number 54397USA1A, entitled "Thermal Transfer Donor Element having a Heat Management Underlayer").

The underlayer can include materials that impart desired mechanical and/or thermal properties to the donor element. For example, the underlayer can include materials that exhibit a low (specific heat x density) and/or low thermal conductivity relative to the donor substrate. Such an underlayer may be used to increase heat flow to the transfer layer, for example to improve the imaging sensitivity of the donor.

The underlayer may also include materials for their mechanical properties or for adhesion between the substrate and the LTHC. Using an underlayer that improves adhesion between the substrate and the LTHC layer may result in less distortion in the transferred image. As an example, in some cases an underlayer can be used that reduces or eliminates delamination or separation of the LTHC layer, for example, that might otherwise occur during imaging of the donor media. This can reduce the amount of physical distortion exhibited by transferred portions of the transfer layer. In other cases, however it may be desirable to employ underlayers that promote at least some degree of separation between or among layers during imaging, for example to produce an air gap between layers during imaging that can provide a thermal insulating function. Separation during imaging may also provide a channel for the release of gases that may be generated by heating of the LTHC layer during imaging. Providing such a channel may lead to fewer imaging defects.

The underlayer may be substantially transparent at the imaging wavelength, or may also be at least partially absorptive or reflective of imaging radiation. Attenuation and/or reflection of imaging radiation by the underlayer may be used to control heat generation during imaging.

The underlayer can be comprised of any of a number of known polymers such as thermoset (crosslinked), thermosettable (crosslinkable), or thermoplastic polymers, including acrylates (including methacrylates, blends, mixtures, copolymers, terpolymers, tetrapolymers, oligomers, macromers, etc.), polyols (including polyvinyl alcohols), epoxy resins (also including copolymers, blends, mixtures, terpolymers, tetrapolymers, oligomers, macromers, etc.), silanes, siloxanes (with all types of variants thereof), polyvinyl pyrrolidinones, polyesters, polyimides, polyamides, poly (phenylene sulphide), polysulphones, phenol-formaldehyde resins, cellulose ethers and esters (for example, cellulose acetate, cellulose acetate butyrate, etc.), nitrocelluloses, polyurethane, polyesters (for example, poly (ethylene terephthalate), polycarbonates, polyolefin polymers (for example, polyethylene, polypropylene, polychloroprene, polyisobutylene, polytetrafluoroethylene, polychlorotrifluoroethylene, poly (p-chlorostyrene), polyvinylidene fluoride, polyvinylchloride, polystyrene, etc.) and copolymers (for example, polyisobutene-co-isoprene, etc.), polymerizable compositions comprising mixtures of these polymerizable active groups (e.g., epoxy-siloxanes, epoxy-silanes, acryloyl-silanes, acryloyl-siloxanes, acryloylepoxies, etc.), phenolic resins (e.g., novolak and resole resins), polyvinylacetates, polyvinylidene chlorides, polyacrylates, , nitrocelluloses, polycarbonates, and mixtures thereof. The underlayers may include homopolymers or copolymers (including, but not limited to random copolymers, graft copolymers, block copolymers, etc.).

Underlayers may be formed by any suitable means, including coating, laminating, extruding, vacuum or vapor depositing, electroplating, and the like. For example, crosslinked underlayers may be formed by coating an uncrosslinked material onto a donor substrate and crosslinking the coating. Alternatively a crosslinked underlayer may be initially formed and then laminated to the substrate subsequent to crosslinking. Crosslinking can take place by any means known in the art, including exposure to radiation and/or thermal energy and/or chemical curatives (water, oxygen, etc.).

The thickness of the underlayer is typically greater than that of conventional adhesion primers and release layer coatings, preferably greater than 0.1 microns, more preferably greater than 0.5 microns, most preferably greater than 1 micron. In some cases, particularly for inorganic or metallic underlayers, the underlayer can be much thinner. For example, thin metal underlayers that are at least partially reflective at the imaging wavelength might be useful in imaging systems where the donor elements are irradiated from the transfer layer side. In other cases, the underlayers can be much thicker than these ranges, for example when the underlayer is included to provide some mechanical support in the donor element.

Referring again to FIG. 1, an LTHC layer 114 can be included in thermal mass transfer elements of the present invention to couple irradiation energy into the thermal transfer element. The LTHC layer preferably includes a radiation absorber that absorbs incident radiation (e.g., laser light) and converts at least a portion of the incident radiation into heat to enable transfer of the transfer layer from the thermal transfer element to the receptor.

Generally, the radiation absorber(s) in the LTHC layer absorb light in the infrared, visible, and/or ultraviolet regions of the electromagnetic spectrum and convert the absorbed radiation into heat. The radiation absorber materials are typically highly absorptive of the selected imaging radiation, providing an LTHC layer with an optical density at the wavelength of the imaging radiation in the range of about 0.2 to 3 or higher. Optical density is the absolute value of the logarithm (base 10) of the ratio of the intensity of light transmitted through the layer to the intensity of light incident on the layer.

Radiation absorber material can be uniformly disposed throughout the LTHC layer or can be non-homogeneously distributed. For example, as described in co-assigned U.S. patent application Ser. No. 09/474,002 (attorney docket number 54992USA9A, entitled "Thermal Mass Transfer Donor Elements"), non-homogeneous LTHC layers can be used to control temperature profiles in donor elements. This can give rise to thermal transfer elements that have improved transfer properties (e.g., better fidelity between the intended transfer patterns and actual transfer patterns).

Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of suitable radiation absorbers includes carbon black, metal oxides, and metal sulfides. One example of a suitable LTHC layer can include a pigment, such as carbon black, and a binder, such as an organic polymer. Another suitable LTHC layer includes metal or metal/metal oxide formed as a thin film, for example, black aluminum (i.e., a partially oxidized aluminum having a black visual appearance). Metallic and metal compound films may be formed by techniques, such as, for example, sputtering and evaporative deposition. Particulate coatings may be formed using a binder and any suitable dry or wet coating techniques. LTHC layers can also be formed by combining two or more LTHC layers containing similar or dissimilar materials. For example, an LTHC layer can be formed by vapor depositing a thin layer of black aluminum over a coating that contains carbon black disposed in a binder.

Dyes suitable for use as radiation absorbers in a LTHC layer may be present in particulate form, dissolved in a binder material, or at least partially dispersed in a binder material. When dispersed particulate radiation absorbers are used, the particle size can be, at least in some instances, about 10 $\mu$m or less, and may be about 1 $\mu$m or less. Suitable dyes include those dyes that absorb in the IR region of the spectrum. For example, IR absorbers marketed by Glendale Protective Technologies, Inc., Lakeland, Fla., under the designation CYASORB IR-99, IR-126 and IR-165 may be used. A specific dye may be chosen based on factors such as, solubility in, and compatibility with, a specific binder and/or coating solvent, as well as the wavelength range of absorption.

Pigmentary materials may also be used in the LTHC layer as radiation absorbers. Examples of suitable pigments include carbon black and graphite, as well as phthalocyanines, nickel dithiolenes, and other pigments described in U.S. Pat. Nos. 5,166,024 and 5,351,617. Additionally, black azo pigments based on copper or chromium complexes of, for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) may also be used.

Metal radiation absorbers may be used, either in the form of particles, as described for instance in U.S. Pat. No. 4,252,671, or as films, as disclosed in U.S. Pat. No. 5,256,506. Suitable metals include, for example, aluminum, bismuth, tin, indium, tellurium and zinc.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, and polycarbonates. Suitable binders may include monomers, oligomers, or polymers that have been, or can be, polymerized or crosslinked. Additives such as photoinitiators may also be included to facilitate crosslinking of the LTHC binder. In some embodiments, the binder is primarily formed using a coating of crosslinkable monomers and/or oligomers with optional polymer.

The inclusion of a thermoplastic resin (e.g., polymer) may improve, in at least some instances, the performance (e.g., transfer properties and/or coatability) of the LTHC layer. It is thought that a thermoplastic resin may improve the adhesion of the LTHC layer to the donor substrate. In one embodiment, the binder includes 25 to 50 wt. % (excluding the solvent when calculating weight percent) thermoplastic resin, and, preferably, 30 to 45 wt. % thermoplastic resin, although lower amounts of thermoplastic resin may be used (e.g., 1 to 15 wt. %). The thermoplastic resin is typically chosen to be compatible (i.e., form a one-phase combination) with the other materials of the binder. In at least some embodiments, a thermoplastic resin that has a solubility parameter in the range of 9 to 13 $(cal/cm^3)^{1/2}$, preferably, 9.5 to 12 $(cal/cm^3)^{1/2}$, is chosen for the binder. Examples of suitable thermoplastic resins include polyacrylics, styrene-acrylic polymers and resins, and polyvinyl butyral.

Conventional coating aids, such as surfactants and dispersing agents, may be added to facilitate the coating process. The LTHC layer may be coated onto the donor substrate using a variety of coating methods known in the art. A polymeric or organic LTHC layer is coated, in at least some instances, to a thickness of 0.05 $\mu$m to 20 $\mu$m, preferably, 0.5 $\mu$m to 10 $\mu$m, and, more preferably, 1 $\mu$m to 7 $\mu$m. An inorganic LTHC layer is coated, in at least some instances, to a thickness in the range of 0.0005 to 10 $\mu$m, and preferably, 0.001 to 1 $\mu$m.

Referring again to FIG. 1, an optional interlayer 118 may be disposed between the LTHC layer 114 and transfer layer 116. The interlayer can be used, for example, to minimize damage and contamination of the transferred portion of the transfer layer and may also reduce distortion in the transferred portion of the transfer layer. The interlayer may also influence the adhesion of the transfer layer to the rest of the thermal transfer donor element. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the interlayer is 25° C. or greater, preferably 50° C. or greater, more preferably 100° C. or greater, and, most preferably, 150° C. or greater. In some embodiments, the interlayer includes a thermoplastic material that has a $T_g$ greater than any temperature attained in the transfer layer during imaging. The interlayer may be either transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat-conversion layer via conventional techniques (e.g., vacuum sputtering, vacuum evaporation, or plasma jet deposition).

The interlayer may provide a number of benefits. The interlayer may be a barrier against the transfer of material from the light-to-heat conversion layer. It may also modulate the temperature attained in the transfer layer so that thermally unstable materials can be transferred. For example, the interlayer can act as a thermal diffuser to control the temperature at the interface between the interlayer and the transfer layer relative to the temperature attained in the LTHC layer. This may improve the quality (i.e., surface roughness, edge roughness, etc.) of the transferred layer. The presence of an interlayer may also result in improved plastic memory in the transferred material.

The interlayer may contain additives, including, for example, photoinitiators, surfactants, pigments, plasticizers, and coating aids. The thickness of the interlayer may depend on factors such as, for example, the material of the interlayer, the material and properties of the LTHC layer, the material and properties of the transfer layer, the wavelength of the imaging radiation, and the duration of exposure of the thermal transfer element to imaging radiation. For polymer interlayers, the thickness of the interlayer typically is in the range of 0.05 $\mu$m to 10 $\mu$m. For inorganic interlayers (e.g., metal or metal compound interlayers), the thickness of the interlayer typically is in the range of 0.005 $\mu$m to 10 $\mu$m.

Referring again to FIG. 1, a thermal transfer layer 116 is included in thermal mass transfer donor elements of the present invention. Transfer layer 116 can include any suitable material or materials, disposed in one or more layers with or without a binder, that can be selectively transferred as a unit or in portions by any suitable transfer mechanism when the donor element is exposed to direct heating or to imaging radiation that can be absorbed by the LTHC layer and converted into heat.

Specifically, the present invention contemplates a transfer layer that includes a blend of an LEP and an additive. The additive can be selected to promote thermal transfer of the LEP material. For example, the presence of the additive can reduce cohesive energy in an LEP, thereby allowing it to be pattern-wise transferred with higher fidelity. By higher fidelity pattern-wise transfer it is meant that the pattern of material actually transferred from the thermal transfer donor element to the receptor more closely matches the intended transfer pattern. The additive can also improve adhesion of the LEP to the receptor upon thermal transfer, particularly when the LEP blend is the outermost layer of the thermal transfer donor element.

The selection of an additive generally depends on the choice of LEP material in the blend. As a first consideration, the additive and LEP should be compatible. Preferably, the additive and LEP are both soluble in a solvent used to coat the blend onto donor element when making the donor, and the blend is capable of forming a uniform film when cast or coated. In some cases, it may be desirable for the additive material to form domains in the LEP material when blended. For example, the formation of micro-domains of the additive in the LEP may reduce the intra-layer cohesive strength enough to achieve high fidelity thermal transfer while also allowing the emissive layer to exhibit uniform electronic and emissive properties. Other considerations when selecting blend materials include relative amounts of LEP to additive (and other optional materials) in the blend, whether to use active materials as additives in the blend, how the additive might affect the electronic and/or emissive properties of the LEP, and the like.

Examples of blends of LEPs and suitable additives include the following: LEPs blended with oligomers of the same LEP material; LEPs blended with inert polymers (e.g., polyfluorene LEPs blended with polystyrene); LEPs blended with active polymers such as other LEPs, conductive polymers, and the like; LEPs blended with active organic small molecule materials; molecularly doped LEPs blended with suitable additives; fluorescent dye dispersed LEPs blended with suitable additives; co-polymers of LEPs blended with suitable additives; LEPs that comprise backbone polymers having active pendent groups blended with suitable additives; and the like.

Examples of other transfer layers that can be selectively patterned from other thermal mass transfer donor elements, in combination with or in addition to LEP blends, include colorants (e.g., pigments and/or dyes dispersed in a binder), polarizers, liquid crystal materials, particles, insulating materials, conductive materials, charge transport materials, charge injection materials, emissive materials (e.g., phosphors or organic electroluminescent materials), hydrophobic materials (e.g., partition banks for ink jet receptors), hydrophilic materials, multilayer stacks (e.g., layers suitable for multilayer device constructions such as organic electroluminescent devices), microstructured or nanostructured layers, photoresist, metals, polymers, adhesives, binders, and other suitable materials or combination of materials. These and other transfer layers are disclosed in the following documents: U.S. Pat. Nos. 6,114,088; 5,998,085; 5,725,989; 5,710,097; 5,693,446; 5,691,098; 5,685,939; and 5,521,035; International Publication Nos. WO 97/15173, WO 99/46961, and WO 00/41893.

Thermal mass transfer according to the present invention can be performed to pattern one or more materials on a receptor with high precision and accuracy using fewer processing steps than for photolithography-based patterning techniques, and for materials that are not well-suited for photolithographic patterning (e.g., light emitting polymers), and thus can be especially useful in applications such as high resolution display manufacture. As such, transfer layers that include LEP blends can be made so that, upon selective thermal transfer to a receptor, the transferred materials form one or more layers, including the emissive layer of an OLED. Multiple OLEDs can be patterned serially (from one or more donor elements) or simultaneously on a receptor to make segmented or pixilated displays that are monochromatic, multi-color, or full color.

In particularly suited embodiments, the transfer layer can include one or more materials useful in emissive displays such as OLED displays. For example, the transfer layer can include, along with a blend of an LEP and an additive, an organic small molecule light emitter, an organic charge transport or charge injection material, as well as other organic conductive or semiconductive materials. Thermal transfer of materials from donor sheets to receptors for emissive display and device applications is disclosed in U.S. Pat. Nos. 6,114,088 and 5,998,085, and in International Publication 00/41893.

In at least some instances, an OLED includes a thin layer, or layers, of one or more suitable organic materials sandwiched between a cathode and an anode. Electrons are injected into the organic layer(s) from the cathode and holes are injected into the organic layer(s) from the anode. As the injected charges migrate towards the oppositely charged electrodes, they may recombine to form electron-hole pairs which are typically referred to as excitons. These excitons, or excited state species, may emit energy in the form of light as they decay back to a ground state (see, for example, T. Tsutsui, *MRS Bulletin*, 22, pp. 39–45 (1997)). Materials useful in OLEDs are disclosed by J. L. Segura, "The Chemistry of Electroluminescent Organic Materials", *Acta Polym.*, 49, pp. 319–344 (1998) and by A. Kraft et al., "Electroluminescent Conjugated Polymers—Seeing Polymers in a New Light", *Angew. Chem. Int. Ed.*, 37, pp. 402–428 (1998).

Illustrative examples of OLED constructions include molecularly dispersed polymer devices where charge carrying and/or emitting species are dispersed in a polymer matrix (see J. Kido "Organic Electroluminescent devices Based on Polymeric Materials", *Trends in Polymer Science*, 2, pp. 350–355 (1994)), conjugated polymer devices where layers of polymers such as polyphenylene vinylene act as the charge carrying and emitting species (see J. J. M. Halls et al., *Thin Solid Films*, 276, pp. 13–20 (1996)), vapor deposited small molecule heterostructure devices (see U.S. Pat. No. 5,061,569 and C. H. Chen et al., "Recent Developments in Molecular Organic Electroluminescent Materials", *Macromolecular Symposia*, 125, pp. 1–48 (1997)), light emitting electrochemical cells (see Q. Pei et al., *J. Amer. Chem. Soc.*, 118, pp. 3922–3929 (1996)), and vertically stacked organic light-emitting diodes capable of emitting light of multiple wavelengths (see U.S. Pat. No. 5,707,745 and Z. Shen et al., *Science*, 276, pp. 2009–2011 (1997)).

The donor element can also include an optional transfer assist layer, most typically provided as a layer of an adhesive or an adhesion promoter coated on the transfer layer as the outermost layer of the donor element. The transfer assist layer can serve to promote complete transfer of the transfer layer, especially during the separation of the donor from the receptor substrate after imaging. Exemplary transfer assist layers include colorless, transparent materials with a slight tack or no tack at room temperature, such as the family of resins sold by ICI Acrylics under the trade designation Elvacite (e.g., Elvacite 2776). The transfer assist layer may also contain a radiation absorber that absorbs light of the same frequency as the imaging laser or light source. Transfer assist layers can also be optionally disposed on the receptor.

The receptor substrate may be any item suitable for a particular application including, but not limited to, glass, transparent films, reflective films, metals, semiconductors, various papers, and plastics. For example, receptor substrates may be any type of substrate or display element suitable for display applications. Receptor substrates suitable for use in displays such as liquid crystal displays or emissive displays include rigid or flexible substrates that are substantially transmissive to visible light. Examples of suitable rigid receptors include glass and rigid plastic that are coated or patterned with indium tin oxide and/or are circuitized with low temperature polysilicon (LTPS) or other transistor structures, including organic transistors. Suitable flexible substrates include substantially clear and transmissive polymer films, reflective films, transflective films, polarizing films, multilayer optical films, and the like. Flexible substrates can also be coated or patterned with electrode materials or transistors. Suitable polymer substrates include polyester base (e.g., polyethylene terephthalate, polyethylene naphthalate), polycarbonate resins, polyolefin resins, polyvinyl resins (e.g., polyvinyl chloride, polyvinylidene chloride, polyvinyl acetals, etc.), cellulose ester bases (e.g., cellulose triacetate, cellulose acetate), and other conventional polymeric films used as supports. For making OLEDs on plastic substrates, it is often desirable to include a barrier film or coating on one or both surfaces of the plastic substrate to protect the organic light emitting devices and their electrodes from exposure to undesired levels of water, oxygen, and the like.

Receptor substrates can be pre-patterned with any one or more of electrodes, transistors, capacitors, insulator ribs, spacers, color filters, black matrix, and other elements useful for electronic displays or other devices.

An active primer layer can also be disposed between the donor and receptor during thermal transfer operations to facilitate transfer of materials. The idea of an active primer is disclosed in co-assigned and co-filed U.S. patent application Ser. No. 09/662,845, entitled "Electronically Active Primer Layers for Thermal Patterning of Materials for Electronic Devices"). An active primer includes materials to promote adhesion or other transfer properties during selective thermal mass transfer and to maintain device functionality. In practice, the active primer layer can be coated onto the transfer layer of the donor sheet, onto the receptor, or both. Also, the active primer layer can be coated to form a single continuous layer on the donor or receptor, or the active primer layer can be patterned on the donor or the receptor. An active primer layer can be patterned by any suitable technique including photolithography, screen printing, selective thermal transfer, deposition through a mask, and the like. When using a patterned active primer layer, it may be desirable to pattern the active primer directly onto the receptor only in those areas where the transfer layer is to be selectively thermally transferred.

When using an active primer layer during transfer of LEP blends of the present invention, it might be desirable for at least one of the materials included in the active primer to match at least one of the materials included in the LEP blend. This type of material matching may improve the quality of the interface formed between the LEP blend layer and the active primer layer after transfer.

After transfer of the LEP blends, other device layers can be deposited and/or patterned. Such other device layers can include charge transport materials, cathode layers, and the like. Insulator ribs can also be patterned after transfer of emissive layers, for example to electronically isolate adjacent devices before deposition of a common cathode. Patterning of these and other such layers can be performed by any suitable method including photolithography, thermal transfer, deposition through a mask, and the like. For OLEDs, it is often desirable to encapsulate the devices by coating the finished devices with one or more layers that form a barrier to water, oxygen, and other elements in the environment to which the patterned devices may be susceptible.

EXAMPLES

The following examples illustrate the use of LEP blends as transfer layers in thermal transfer donor elements that can be used to make OLEDs.

Example 1

Preparation of a Receptor with a PEDT/PSS Buffer Layer

A receptor substrate having a PEDT/PSS buffer layer was prepared in the following manner.

An indium tin oxide (ITO) striped substrate was spin coated at 2000 r.p.m. with a buffer solution consisting of poly(3,4-ethylenedioxythiophene)/poly(styrene sulfonicacid) (PEDT/PSS) in de-ionized water (99.5:0.5 water to PEDT/PSS, by weight). The PEDT/PSS buffer material was the PEDT/PSS commercially available from Bayer Corporation under the trade designation Baytron P 4083. The PEDT/PSS coated substrate was heated at 110° C. on a hot plate for 5 minutes in air. The PEDT/PSS coating serves as a hole injecting buffer layer in OLEDs.

Example 2

Preparation of a Receptor with an Active Primer Layer

A receptor substrate having an active primer layer was prepared in the following manner.

An indium tin oxide (ITO) striped substrate was spin coated at 2000 r.p.m. with a buffer solution consisting of PEDT/PSS in de-ionized water (70:30 water to PEDT/PSS, by weight). The PEDT/PSS coated substrate was heated at 110° C. on a hot plate for 5 minutes in air. The PEDT/PSS coating served as a hole injecting buffer layer in the patterned OLEDs (see Example 7). An active primer layer was then coated over the PEDT/PSS coating. The active primer layer was a 1:1 dispersion of bis(3-methylphenyl)N,N' dimethylbenzidine (TPD) in polystyrene (50,000 MW, available from Polysciences). The TPD was obtained from Aldrich Chemical Company, Milwaukee, Wis. The polystyrene used had a 50,000 molecular weight and was obtained from Polysciences, Warrington, Pa. The active primer was spin coated onto the PEDT/PSS layer out of a 1.5% weight-to-volume toluene solution.

Example 3 (Comparative)

Preparation of a Donor Sheet with a PPV Transfer Layer

A thermal transfer donor sheet having a light emitting polymer transfer layer was prepared in the following manner.

An LTHC solution, given in Table 1, was coated onto a 0.1 mm thick polyethylene terapthalate (PET) film substrate. Coating was performed using a Yasui Seiki Lab Coater, Model CAG-150, using a microgravure roll with 150 helical cells per lineal inch. The LTHC coating was in-line dried at 80° C. and cured under ultraviolet (UV) radiation.

TABLE I

LTHC Coating Solution

| Component | Trade Designation | Parts by Weight |
| --- | --- | --- |
| carbon black pigment | Raven 760 Ultra[1] | 3.88 |
| polyvinyl butyral resin | Butvar B-98[2] | 0.69 |
| acrylic resin | Joncryl 67[3] | 2.07 |
| dispersant | Disperbyk 161[4] | 0.34 |
| surfactant | FC-430[5] | 0.01 |
| epoxy novolac acrylate | Ebecryl 629[6] | 13.18 |
| acrylic resin | Elvacite 2669[7] | 8.79 |
| 2-benzyl-2-(dimethylamino)-1-(4-(morpholinyl)phenyl)butanone | Irgacure 369[8] | 0.89 |
| 1-hydroxycyclohexyl phenyl ketone | Irgacure 184[8] | 0.13 |
| 2-butanone | | 43.75 |
| 1,2-propanediol monomethyl ether acetate | | 26.25 |

[1]available from Columbian Chemicals Co., Atlanta, GA
[2]available from Solutia Inc., St. Louis, MO
[3]available from S. C. Johnson & Son. Inc., Racine, WI
[4]available from Byk-Chemie USA, Wallingford, CT
[5]available from Minnesota Mining and Manufacturing Co., St. Paul, MN
[6]available from UCB Radcure Inc., N. Augusta, SC
[7]available from ICI Acrylics Inc., Memphis, TN
[8]available from Ciba-Geigy Corp., Tarrytown, NY Next, an interlayer, given in Table II, was coated onto the cured LTHC layer by a rotogravure coating method using the Yasui Seiki Lab Coater, Model CAG-150, with a microgravure roll having 180 helical cells per lineal inch. This coating was in-line dried at 60° C. and UV cured.

TABLE II

Interlayer Coating Solution

| Component | Parts by Weight |
| --- | --- |
| SR 351 HP (trimethylolpropane triacrylate ester, available from Sartomer, Exton, PA) | 14.85 |
| Butvar B-98 | 0.93 |
| Joncryl 67 | 2.78 |
| Irgacure 369 | 1.25 |
| Irgacure 184 | 0.19 |
| 2-butanone | 48.00 |
| 1-methoxy-2-propanol | 32.00 |

Next, a PPV light emitting polymer was spin coated out of a 0.9% weight-to-volume toluene solution onto the cured interlayer. The PPV was one commercially available from Covion Organic Semiconductors GmbH, Frankfurt, Germany, and identified as COVION PDY 132.

Example 4

Preparation of a Donor Sheet with a PPV/Polystyrene Blend Transfer Layer

A thermal transfer donor sheet having a light emitting polymer blend transfer layer was prepared in the following manner.

An LTHC solution was coated onto a 0.1 mm thick PET film substrate as in Example 3. Next, an interlayer was coated onto the cured LTHC layer as in Example 3. Next, a 1:1 by weight blend of a PPV light emitting polymer and polystyrene was spin coated out of a 0.5% weight-to-volume toluene solution onto the cured interlayer. The PPV was one commercially available from Covion Organic Semiconductors GmbH, Frankfurt, Germany, and identified as COVION PDY 132. The polystyrene used had a 50,000 molecular weight and was obtained from Polysciences, Warrington, Pa.

Example 5

Thermal Imaging of a PPV and a PPV/Polystyrene Blend onto Receptors

The PPV and PPV blend donor elements prepared in Examples 3 and 4 were used to thermally transfer patterns onto receptors in the following manner.

Donor sheets as prepared in Examples 3 and 4 were brought into contact with receptor substrates as prepared in Examples 1 and 2 for imaging of the PPV and PPV blend transfer layers onto the receptors. Thus, there were four combinations: the PPV donor of Example 3 on the buffer receptor of Example 1, the PPV donor of Example 3 on the active primer receptor of Example 2, the PPV blend donor of Example 4 on the buffer receptor of Example 1, and the PPV blend donor of Example 4 on the active primer receptor of Example 2.

In each case, the transfer layers of the respective donors were contacting the buffer layer or the active primer layer of the corresponding receptors. Next, the donors were imaged using two single-mode Nd:YAG lasers. Scanning was performed using a system of linear galvanometers, with the combined laser beams focused onto the image plane using an f-theta scan lens as part of a near-telecentric configuration. The laser energy density was 0.55 J/cm$^2$. The laser spot size, measured at the 1/e$^2$ intensity, was 30 microns by 350 microns. The linear laser spot velocity was adjustable between 10 and 30 meters per second, measured at the image plane. The laser spot was dithered perpendicular to the major displacement direction with about a 100 $\mu$m amplitude. The transfer layers were transferred as lines onto the receptor substrates, and the intended width of the lines was about 90 $\mu$m.

The transfer layers were transferred in a series of lines that were in overlying registry with the ITO stripes on the receptor substrates. The results of imaging are given in Table III.

TABLE III

Imaging Results for PPV and PPV Blend

| Donor Type (transfer layer) | Receptor (receptor coating) | Results |
| --- | --- | --- |
| Example 3 (PPV) | Example 1 (buffer only) | no transfer |
| Example 4 (PPV blend) | Example 1 (buffer only) | very little transfer |
| Example 3 (PPV) | Example 2 (buffer + active primer) | good fidelity transfer |
| Example 4 (PPV blend) | Example 2 (buffer + active primer) | highest fidelity transfer |

The imaging results reported in Table III indicate that the use of a PPV/polystyrene blend improved transfer onto a receptor that included an active primer layer versus transfer of the pure PPV onto the active primer substrate. While good fidelity transfer was noted for the pure PPV onto the active primer substrate, the highest fidelity transfer was achieved using the PPV blend on the active primer substrate. The difference in transfer quality for pure PPV versus the PPV blend onto receptors with no active primer layer was less conclusive.

Example 6

Thermal Imaging of a PF and a PF/Polystyrene Blend

Donor sheets and receptors were prepared and imaged in a manner identical to the procedure described in Examples 1 through 5, except that the transfer layers of the respective donor elements were made by coating dilute solutions of a light emitting polyfluorene (PF) and a 1:1 by weight blend of PF/polystyrene. Imaging results are reported in Table IV for the analogues of the four cases discussed in Example 5.

TABLE IV

Imaging Results for PF and PF Blend

| Donor Transfer Layer | Receptor (receptor coating) | Results |
|---|---|---|
| PF | Example 1 (buffer only) | no transfer |
| PF Blend | Example 1 (buffer only) | high fidelity transfer |
| PF | Example 2 (buffer + active primer) | poor transfer (blocking) |
| PF Blend | Example 2 (buffer + active primer) | highest fidelity transfer |

The imaging results reported in Table IV indicate that for each receptor type (active primer or buffer only), the PF blend showed significantly improved transfer as compared to the pure PF. On buffer only receptors, the PF blend exhibited high fidelity transfer whereas the pure PF showed no transfer. On the active primer receptors, the PF blend exhibited very high fidelity transfer whereas the pure PF exhibited poor fidelity transfer. The type of poor transfer exhibited by the pure PF onto the active primer receptor is referred to as "blocking", and can be described as significant amounts of the transfer layer being transferred to non-intended areas, as well as to the intended areas, of the receptor.

Example 7

Preparation of an OLED

An OLED was prepared in the following manner. To make the OLED, the active primer receptor of Example 2 was imaged using the PPV blend donor element of Example 4 as described in Example 5.

Insulating ribs were patterned as stripes on top of, and positioned between each of, the transferred PPV/polystyrene blend lines. A highly filled thermoset polymer formulation was used for the insulating ribs. The approximately 1.6 micron high ribs were patterned using the laser thermal transfer method. The transferred ribs overlapped the PPV/polystyrene lines by about 10 microns on each side. Next, a 400 Angstrom thick calcium coating was vapor deposited over the insulating ribs and PPV stripes. Next, a 4000 Angstrom thick aluminum coating was vapor deposited over the calcium coating. The calcium/aluminum construction served as a double layer cathode in the OLED. The insulator ribs maintain electrical isolation between OLED devices. The result was a series of patterned OLEDs on the glass receptor, each OLED including an ITO anode, a PEDT/PSS buffer layer, an active primer layer that functioned as a hole transport layer and transfer assist layer, a light emitting polymer (PPV) blend layer, and a common double layer cathode isolated by insulator ribs positioned between the OLEDs. Upon application of a bias voltage across the anode and cathode, bright yellow electroluminescence was observed from each of the patterned OLEDs.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

Each of the patents, patent documents, and publications cited above is hereby incorporated into this document as if reproduced in full.

What is claimed is:

1. A thermal transfer donor element comprising a substrate and a transfer layer capable of being selectively thermally transferred from the donor element, the transfer layer comprising a blend of a light emitting polymer and an additive that forms domains in the light emitting polymer, the additive being selected to promote high fidelity thermal transfer of the transfer layer and the blend being capable of forming an emissive layer of an organic electroluminescent device.

2. The donor element of claim 1, further comprising a light-to-heat conversion layer disposed between the base substrate and the transfer layer.

3. The donor element of claim 2, further comprising an interlayer disposed between the light-to-heat conversion layer and the transfer layer.

4. The donor element or claim 1, further comprising a transfer assist layer disposed on the transfer layer so that the transfer layer is between the base substrate and the transfer assist layer.

5. The donor element of claim 1, wherein the light emitting polymer comprises a poly(phenylenevinylene).

6. The donor element of claim 1, wherein the light emitting polymer comprises a poly-para-phenylene.

7. The donor element of claim 1, wherein the light emitting polymer comprises a polyfluorene.

8. The donor element of claim 1, wherein the light emitting polymer comprises a co-polymer.

9. The donor element of claim 1, wherein the light emitting polymer includes a molecular dopant.

10. The donor element of claim 1, wherein the light emitting polymer includes a fluorescent dye.

11. The donor element of claim 1, wherein the additive comprises an oligomer of the light emitting polymer.

12. The donor element of claim 1, wherein the additive comprises an organic small molecule material.

13. The donor element of claim 1, wherein the additive comprises an inert polymer.

14. The donor element of claim 1, wherein the additive comprises a conductive polymer.

15. The donor element of claim 1, wherein the additive comprise a conjugated polymer.

16. The donor element of claim 1, wherein the blend comprises polystyrene dispersed in a poly(phenylenevinylene).

17. The donor element of claim 16, wherein the weight ratio of polystyrene to poly(phenylenevinylene) in the blend is about 1:1.

18. The donor element of claim 1, wherein the transfer layer further comprises an organic charge conductive or semiconductive material disposed in a layer adjacent to the blend.

19. A process for patterning a light emitting polymer comprising the steps of:
   providing a thermal transfer donor element comprising a substrate and a transfer layer comprising a blend of a light emitting polymer and an additive that forms domains in the light emitting polymer, the additive being selected to promote high fidelity thermal transfer of the transfer layer and the blend being capable of forming an emissive layer of an organic electroluminescent device;
   bringing the donor element into close proximity with a receptor substrate; and
   selectively thermally transferring portions of the transfer layer from the donor to the receptor.

20. The process of claim 19, further comprising repeating the steps using another donor element comprising a substrate and a transfer layer comprising an organic light emitting material.

21. The process of claim 19, wherein the donor element further comprises a light to heat conversion layer disposed between the substrate and the transfer layer.

22. The process of claim 21, wherein the donor element further comprises an interlayer disposed between the light to heat conversion layer and the transfer layer.

23. The process of claim 19, wherein the receptor further comprises a pattern of electrodes.

24. The process of claim 23, wherein the receptor further comprises a buffer layer disposed on the pattern of electrodes.

25. The process of claim 23, wherein the receptor further comprises an active primer layer disposed on the pattern of electrodes.

26. The process of claim 25, wherein the active primer layer comprises a material that matches a material included in the blend.

* * * * *

UNITED STATES PATENT AND TRADEMARK OFFICE
CERTIFICATE OF CORRECTION

PATENT NO.     : 6,855,384 B1
DATED          : February 15, 2005
INVENTOR(S)    : Nirmal, Manoj It is certified that error appears in the above-identified patent and that said Letters Patent is hereby corrected as shown below:

Column 1,
Line 4, insert -- This invention relates to thermal transfer of emissive materials from donor sheets to receptor substrates. -- above "Background"
Line 56, delete "clement" and insert -- element --, therefor.

Column 2,
Line 45, delete "Polyrn" and insert -- Polym --, therefor.

Column 7,
Line 13, delete "polyarnides" and insert -- polyamides --, therefor.
Line 27, delete "acryloylepoxies" and insert -- acryloyl-epoxies --, therefor.

Column 12,
Line 33, delete "arc" and insert -- are --, therefor.

Column 15,
Line 1, delete "Table 1" and insert -- Table I --, therefor.

Column 18,
Line 20, delete "or" and insert -- of --, therefor.
Line 44, delete "comprise" and insert -- comprises --, therefor.
Line 50, delete "clement" and insert -- element --, therefor.

Signed and Sealed this

Seventeenth Day of May, 2005

JON W. DUDAS
*Director of the United States Patent and Trademark Office*